United States Patent [19]
Anzani

[11] 3,916,225
[45] Oct. 28, 1975

[54] BISTABLE CIRCUIT ARRANGEMENT

[75] Inventor: Alberto Anzani, Varese, Italy

[73] Assignee: Bassani S.p.A., Milan, Italy

[22] Filed: July 19, 1974

[21] Appl. No.: 490,215

[30] Foreign Application Priority Data
July 24, 1973 Italy .............................. 26968/73

[52] U.S. Cl. ................. 307/291; 328/196; 328/206
[51] Int. Cl.² ......................................... H03K 3/286
[58] Field of Search ............ 307/289, 291; 328/196, 328/206

[56] References Cited
UNITED STATES PATENTS 3,636,383 1/1972 Clubbe .............................. 307/291
3,678,300 7/1972 Keller ............................ 307/291 X

*Primary Examiner*—John Zazworsky
*Attorney, Agent, or Firm*—Michael S. Striker

[57] ABSTRACT

A bistable circuit arrangement has an input connected to a bistable circuit by way of a first and by way of a second RC network, and means to vary the time constant of the first RC network between two values, one higher and one lower than the time constant of the second RC network in dependence on the condition of the bistable circuit, so that a pulse applied to the input is supplied to the bistable circuit by way of the RC network having the higher value of time constant at the time the pulse is applied to the input.

7 Claims, 1 Drawing Figure

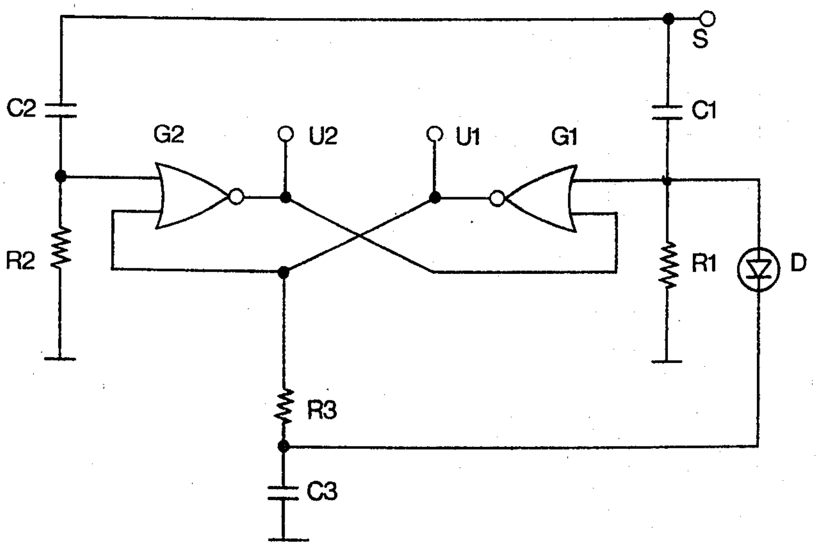
S
C2
C1
G2
U2
U1
G1
R2
R1
D
R3
C3

BISTABLE CIRCUIT ARRANGEMENT

BACKGROUND OF THE INVENTION

Many types of bistable circuit are well known, and such circuits are characterised in that they have two stable conditions or states between which the circuits can be switched. To effect such switching under control of an input pulse necessitates the association with the bistable circuit of ancillary circuitry to effect the routing or control of the input pulse to bring about switching of the bistable circuit from one condition to the other condition irrespective of the initial condition. Such ancillary circuitry may be quite complex and may take up as much or even more space than the bistable circuit.

SUMMARY OF THE INVENTION

One object of the present invention is to provide an improved bistable circuit arrangement.

Another object of the present invention is to provide a bistable circuit arrangement comprising a bistable circuit and simple ancillary networks to effect switching of the bistable circuit under control of an input pulse.

Another object of the present invention is to provide a bistable circuit arrangement comprising a bistable circuit formed by logic gates and means comprising RC networks to effect switching of the bistable circuit under control of an input pulse.

According to the present invention there is provided a bistable circuit arrangement comprising an input terminal and two output terminals; a bistable circuit having two inputs and two outputs, said two outputs being connected to said two output terminals, and said bistable circuit being switchable between two stable conditions in dependence on pulses applied to said two inputs; a first RC network coupling said input terminal to one of aid inputs of said bistable circuit; a second RC network coupling said input terminal to the other of said inputs of said bistable circuit; and means to vary the time constant of said first RC network between two values, one higher and one lower than the time constant of said second RC network in dependence on the condition of said bistable circuit; so that an input pulse applied to said input terminal is supplied to said bistable circuit by way of the one of said RC networks having the higher value of time constant at the time said pulse is applied to said input terminal, whereby said bistable circuit is switched.

Said means to vary the time constant of said first RC network between two values may comprise passive or active storage elements for storing information about the condition of said bistable circuit, and is preferably a third RC network coupled to one said output of said bistable circuit and also coupled to said first RC network by way of a diode.

Said bistable circuit may comprise a pair of cross-coupled logic gates, in particular NOR or NAND gates, but the invention is not limited to such constructions of bistable circuit.

BRIEF DESCRIPTION OF THE DRAWING

The invention will now be described by way of example with reference to the single FIGURE of the accompanying drawing which shows a bistable circuit arrangement.

DESCRIPTION OF A SPECIFIC EMBODIMENT

The bistable circuit arrangement comprises a bistable circuit formed by two NOR gates G1 and G2 each having two inputs and one output. The output of gate G1 is connected to an output terminal U1 of the arrangement and to one (lower) input of gate G2. The output of gate G2 is connected to an output terminal U2 of the arrangement and to one (lower) input of gate G1. The arrangement has an input terminal S connected to first and second RC networks respectively associated with the gates G1 and G2, and comprising capacitors C1 and C2, and resistors R1 and R2 respectively connected in series between the input terminal S and earth. The connection point between the capacitor C1 and the resistor R1 is connected to the other (upper) input of the gate G1, and the connection point between the capacitor C2 and the resistor R2 is connected to the other (upper) input of the gate G2.

As so far described, if gate G1 is supplying an output 1 and gate G2 an output 0, and no input pulse is applied to input terminal S, the situation is:

| | G1 | G2 |
|---|---|---|
| upper input | 0 | 0 |
| lower input | 0 | 1 |
| output | 1 | 0 |

If the time constants of the first and second RC networks were the same and a pulse was applied to the input terminal S, both the capacitors C1 and C2 would charge to the same potential and both charges would decay at the same rate. No satisfactory switching of the bistable circuit would therefore occur.

It is however arranged in the described arrangement that the natural time constant T1 of the first RC network is greater than the time constant T2 of the second RC network. Moreover, the arrangement also comprises a third RC network formed by a resistor R3 and a capacitor C3 connected in series between the output terminal of the gate G1 and earth. The connection point between the capacitor C1 and the resistor R1 is connected by way of a diode D to the connection point between the resistor R3 and the capacitor C3, the cathode terminal of the diode D being connected to the latter connection point.

The component values are selected such that when the gate G1 supplies an output 1 the capacitor C3 charges to a potential sufficient to maintain the diode D non-conducting. The first RC network therefore effectively has its natural time constant, which is greater than the time constant of the second RC network. If a positive pulse is applied to the input terminal S the capacitor C1 will maintain a charge longer than the capacitor C2, so the output of the gate G1 will become 0 and the output of the gate G2 will become 1. In other words, the bistable circuit will switch over.

The charge on the capacitor C3 will then decay and the diode D will conduct. This has the effect of decreasing the effective time constant of the first RC network from its natural value to a value lower than that of the second RC circuit. If a further positive pulse is then applied to the input terminal S, the bistable circuit will switch back to the original condition.

It will be appreciated that if the second pulse is applied so soon after the first that the capacitor C3 has not discharged enough for the diode D to conduct, then the circuit will not switch on the application of the second pulse. This can be a valuable property of the arrangement in certain applications, such as with proximity switches, used for example in lighting installations, where the property can prevent unwanted switching and faulty operation. The time interval between pulses, which interval must be exceeded if the second pulse is not to be rejected in this way, can be selected by choice of appropriate values for the resistor R3 and capacitor C3.

In a modified form of the described bistable circuit arrangement designed for operation with negative input pulses, the gates G1 and G2 are NAND gates and the polarity of the diode D is reversed.

The described arrangement can of course be made with discrete components or made in the form of an integrated circuit, as required. When made with discrete components, the RC networks and the diode D add but little to the basic bistable circuit either in terms of expense or in terms of space occupied.

Various modifications obvious to those skilled in the art can be made without departing from the invention as defined by the appended claims.

I claim

1. A bistable circuit arrangement comprising an input terminal and two output terminals; a bistable circuit having two inputs and two outputs, said two outputs being connected to said two output terminals, and said bistable circuit being switchable between two stable conditions in dependence on pulses applied to said two inputs; a first RC network coupling said input terminal to one of said inputs of said bistable circuit; a second RC network coupling said input terminal to the other of said inputs of said bistable circuit; and means to vary the time constant of said first RC network between two values, one higher and one lower than the time constant of said second RC network in dependence on the condition of said bistable circuit; so that an input pulse applied to said input terminal is supplied to said bistable circuit by way of the one of said RC networks having the higher value of time constant at the time said pulse is applied to said input terminal, whereby said bistable circuit is switched.

2. A bistable circuit arrangement according to claim 1 wherein said means to vary the time constant of said first RC network between two values comprises storage elements for storing information about the condition of said bistable circuit.

3. A bistable circuit arrangement according to claim 1 wherein said means to vary the time constant of said first RC network between two values comprises a third RC network coupled to one of said outputs of the bistable circuit and also coupled to the first RC network by way of a diode.

4. A bistable circuit arrangement according to claim 1 wherein the bistable circuit comprises a pair of cross-coupled logic gates.

5. A bistable circuit arrangement according to claim 1 wherein said bistable circuit comprises a pair of cross-coupled NOR gates.

6. A bistable circuit arrangement according to claim 1 wherein said bistable circuit comprises a pair of cross-coupled NAND gates.

7. A bistable circuit arrangement comprising an input terminal and two output terminals; a bistable circuit having two inputs and two outputs, and comprising two cross-coupled logic gates, said two outputs being connected to said two output terminals, and said bistable circuit being switchable between two stable conditions in which one or other of said logic gates respectively supplies an output signal, in dependence on pulses applied to said two inputs; a first RC network coupling said input terminal to one of said inputs of said bistable circuit; a second RC network coupling said input terminal to the other of said inputs of said bistable circuit; and means comprising a third RC network and a diode to vary the time constant of said first RC network between two values, one value higher and one value lower than the time constant of said second RC network in dependence on which of said logic gates is supplying a signal; so that an input pulse applied to said input terminal is supplied to said bistable circuit by way of the one of said first and second RC networks having the higher value of time constant at the time said input pulse is applied to said input terminal, whereby said bistable circuit is switched.

* * * * *